(12) United States Patent
Abe

(10) Patent No.: US 6,757,311 B2
(45) Date of Patent: Jun. 29, 2004

(54) LASER DIODE, SEMICONDUCTOR LIGHT-EMITTING DEVICE, AND METHOD OF PRODUCTION THEREOF

(75) Inventor: Hiroaki Abe, Miyagi (JP)

(73) Assignee: Sony Corporation (JP)

( * ) Notice: Subject to any disclaimer, the term of this patent is extended or adjusted under 35 U.S.C. 154(b) by 156 days.

(21) Appl. No.: 09/922,666

(22) Filed: Aug. 7, 2001

(65) Prior Publication Data

US 2002/0021725 A1 Feb. 21, 2002

(30) Foreign Application Priority Data

Aug. 8, 2000 (JP) .................................... P2000-240067

(51) Int. Cl.[7] ................................................ H01S 5/00
(52) U.S. Cl. ........................... 372/43; 372/43; 372/44; 372/45; 372/46; 372/47; 372/48; 372/49; 372/50
(58) Field of Search .................................... 372/43–50

(56) References Cited

U.S. PATENT DOCUMENTS

| | | | | |
|---|---|---|---|---|
| 5,787,105 A | * | 7/1998 | Okamoto et al. | 372/50 |
| 5,966,397 A | | 10/1999 | Hirata | 372/46 |
| 6,009,112 A | * | 12/1999 | Uchida | 372/46 |
| 6,358,764 B1 | * | 3/2002 | Nemoto | 438/22 |

OTHER PUBLICATIONS

IEEE Photonics Technology Letters, vol. 10, No. 9, Sep., 1998 "High–Temperature Operation of 650–nm Wavelength AlGaInP Self–Pulsating Laser Diodes".
EPO Search Report of Nov. 7, 2002.

* cited by examiner

Primary Examiner—Paul Ip
Assistant Examiner—Delma R. Flores-Ruiz
(74) Attorney, Agent, or Firm—Rader, Fishman & Grauer PLLC; Ronald P. Kananen

(57) ABSTRACT

A laser diode capable of reducing an operating current and thereby improving long term reliability and able to be produced by a simpler process than in the prior art and a semiconductor light emitting device and a method of production thereof; wherein a first clad layer, an active layer, and a second clad layer are formed on a substrate, a third clad layer and a contact layer are formed on a current injection stripe region thereon, an electrode is formed so as to be connected to the second clad layer in regions other than the current injection stripe region and to be connected to the contact layer, and, at the time of emitting laser light from a laser light oscillation region by injection of a first current to the electrode via the contact layer by application of voltage, a second current which is smaller than the first current is injected in regions other than the current injection stripe region via the second clad layer, so that a laser diode is configured wherein currents at ends of the laser light oscillation region are controlled to generate self pulsation

11 Claims, 17 Drawing Sheets

LASER DIODE, SEMICONDUCTOR LIGHT-EMITTING DEVICE, AND METHOD OF PRODUCTION THEREOF

BACKGROUND OF THE INVENTION

1. Field of the Invention

The present invention relates to a laser diode, a semiconductor light-emitting device, and a method of production thereof, more particularly relates to a laser diode for self pulsation, a semiconductor light-emitting device including a plurality of laser diode elements including the laser diode, and a method of producing the laser diode.

2. Description of the Related Art

Generally, an optical pickup is built in an optical disk apparatus for reading (reproducing) information recorded on an optical recording medium (hereinafter also referred to as an optical disk) optically recording information such as a CD (compact disk), DVD (digital versatile disk), and MD (mini disk) and writing (storing) information thereon.

A laser diode is used for a light source of the above optical disk apparatus and optical pickup.

As the wavelength of the light source, when the types of optical disks (optical disk systems) differ, laser lights of different wavelengths are used. For example, laser light having a wavelength of 780 nm is used for playing back CDs and laser light having a wavelength of 650 nm is used for playing back DVDs.

In recent years, a self pulsation type laser diode has been developed to reduce noise according to returned light of laser light in the laser diode of the 650 nm band for DVDs as above.

A self pulsation type laser diode has the advantage of preventing emission noise caused by high frequency superimposition during laser driving as in the prior art.

As an example of the above self pulsation type laser diode, a structure having a saturatable absorption layer has been developed (refer to *Preprints of 47th Joint Presentations of Applied Physics*, page 1147, lecture 29a-N-2).

FIG. 12 is a cross-sectional view of the above laser diode.

An n-type buffer layer 51 comprised for example of InGaP, an n-type clad layer 52 comprised for example of AlGaInP, an active layer (multiquantum well structure having an oscillation wavelength of 650 nm) 53, and a p-type clad layer 54 comprised for example of AlGaInP are stacked on an n-type substrate 50 comprised for example of GaAs.

A saturatable absorption layer doped at high concentration 55 is formed at the upper layer of the p-type clad layer 54.

Further at the upper layer of that is formed a p-type clad layer 56 comprised for example of AlGaInP so as to protrude out in a current injection stripe region. An n-type block layer 57 made by AlInP is formed at regions except for the current injection stripe region. An n-type layer 58 comprised of GaAs is formed at the upper layer of the p-type clad layer 56 in the current injection stripe region and the block layer 57.

However, the above self pulsation type laser diode of the prior art has the following problems:

1. The operating current is 56 mA when the output is 5 mV at room temperature of 25° C., so the operating current is large.

2. Along with the large operating current, the long term reliability (life) as a laser diode element declines.

3. It is necessary to accurately control the doping amount and layer thickness of the saturatable absorption layer, so there are problems that the degree of self pulsation varies and kink level declines. consequently, the defect rate becomes high in mass production.

4. Two or three epitaxial growth steps are necessary in the production process, so the process becomes complicated.

Also, in recent years, for example, a compatible optical pickup enabling playback of CDs by a DVD optical disk apparatus has been developed. A dual-wavelength monolithic laser diode has been developed wherein for example a laser diode for CD (emission wavelength of 780 nm) and a laser diode for DVD (emission wavelength of 650 nm) are mounted on one chip. Although a laser diode element on the 650 nm side of the dual-wavelength laser as such is desired to be self pulsation type, when trying to incorporate a self pulsation type laser diode of the prior art, three or four epitaxial growth steps are necessary together with the laser diodes on the 780 nm band side and 650 nm band side, so there is a problem that the process becomes long and complicated and the defect rate becomes high in mass production.

SUMMARY OF THE INVENTION

An object of the present invention is to provide a self pulsation type laser diode capable of improving long term reliability by reducing the operating current and able to be produced by less number of epitaxial steps at an improved production yield and a semiconductor light emitting apparatus having a plurality of laser diode elements including the laser diode.

According to a first aspect of the present invention, there is provided a laser diode comprising a first clad layer of a first conductivity type formed on a substrate; an active layer formed at an upper layer of the first clad layer; a second clad layer of a second conductivity type formed at an upper layer of the active layer; a third clad layer of the second conductivity type formed at an upper layer of the second clad layer in a current injection stripe region; a contact layer formed at an upper layer of the third clad layer; and an electrode formed so as to connect the second clad layer in regions other than the current injection stripe region and to connect the contact layer; whereby when a first current is injected from the electrode via the contact layer by applying a predetermined voltage to the electrode and laser light is emitted from a laser light oscillation region near the active layer, a second current which is smaller than the first current is injected in regions other than the current injection stripe region from the electrode via the second clad layer and currents at ends of the laser light oscillation region are controlled for self pulsation.

Preferably, in the laser diode according to the present invention, saturatable absorption regions are formed at the ends of the laser light oscillation region for self pulsation.

Preferably, in the above laser diode according to the present invention, the second clad layer comprises an AlGaInP-based material.

Preferably, in the above laser diode according to the present invention, the material of the electrode at a portion contacting the second clad layer comprises titanium.

Further preferably, the electrode comprises stacked layers of titanium, platinum, and gold and formed so as to contact the second clad layer and contact layer from its titanium side.

Preferably, the above laser diode according to the present invention comprises an etching stop layer between the second clad layer and the third clad layer.

Preferably, in the above laser diode according to the present invention, the degree of self pulsation can be adjusted by a thickness of the third clad layer and a width of the current injection stripe region, and more preferably, the thickness of the third clad layer is in a range of 0.1 to 0.7 μm, or, the width of the current injection stripe region is in a range of 1.5 to 5 μm.

In the above configuration of the laser diode of the present invention, it was found that at the time of injecting a first current from an electrode via the above contact layer and emitting laser light from a laser light oscillation region near the active layer, a second current which is smaller than the current is injected from the electrode via the second clad layer in the regions except for the current injection stripe region, so that the current is suitably dispersed to the end portions of the laser light oscillation region and self pulsation occurs.

Furthermore, the configuration and conditions of a laser diode for controlling the strength of self pulsation, kink, and emission angle characteristics were found.

A self pulsation type laser diode having the above configuration is capable of reducing an operating current from that in the prior art. As a result, long term reliability can be improved. Also, only one epitaxial step is necessary due to the configuration, so the number of epitaxial steps can be reduced from that in the prior art and the production yield can be improved.

According to a second aspect of the present invention, there is provided a semiconductor light emitting device comprising a plurality of laser diode elements, wherein at least one of the laser diode elements comprises: a first clad layer of a first conductivity type formed on a substrate; an active layer formed at an upper layer of the first clad layer; a second clad layer of a second conductivity type formed at an upper layer of the active layer; a third clad layer of the second conductivity type formed at an upper layer of the second clad layer in a current injection stripe region; a contact layer formed at an upper layer of the third clad layer; and an electrode formed so as to connect the second clad layer in regions other than the current injection stripe region and to connect the contact layer; and whereby at least the one of the laser diode elements is a laser diode wherein, when a first current is injected from the electrode via the contact layer by applying a predetermined voltage to the electrode and a laser light is emitted from a laser light oscillation region near the active layer, a second current which is smaller than the first current is injected in regions other than the current injection stripe region from the electrode via the second clad layer and currents at ends of the laser light oscillation region are controlled for self pulsation.

Preferably, the plurality of laser diode elements are formed on the same substrate.

According to the above semiconductor light emitting device, for example, in a dual-wavelength monolithic laser diode wherein a laser diode for CDs (light emitting wavelength of 780 nm) and a laser diode for DVDs (light emitting wavelength of 650 nm) are mounted on one chip, a laser diode of a self pulsation type can be incorporated which has excellent noise characteristics capable of reducing the operating current from that in the prior art whereby long term reliability is improved. Furthermore, the number of epitaxial steps can be reduced from that in the prior art and the production yield can be improved.

According to a third aspect of the present invention, there is provided a method of producing a laser diode, including the steps of forming a first clad layer of a first conductivity type on a substrate; forming an active layer at an upper layer of the first clad layer; forming a second clad layer of a second conductivity type at an upper layer of the active layer; forming a third clad layer of the second conductivity type at an upper layer of the second clad layer; forming a contact layer at an upper layer of the third clad layer; forming a mask layer for protecting a current injection stripe region; removing the third clad layer and the contact layer while leaving the current injection stripe region by using the mask layer as a mask; and forming an electrode so as to connect to the second clad layer in regions other than the current injection stripe region and to cennect the contact layer.

Preferably, a method of producing a laser diode according to the present invention further includes the step of forming an etching stop layer at an upper layer of the second clad layer between the step of forming the second clad layer and the step of forming the third clad layer; wherein the third clad layer is formed at an upper layer of the etching stop layer in the step of forming the third clad layer; and the third clad layer and the contact layer are removed by using the etching stop layer as an etching stop, and furthermore, etching conditions are changed for removing the etching stop layer in the step of removing the third clad layer and the contact layer.

Preferably, in a method of producing a laser diode according to the present invention, titanium is used as a material of the electrode of a portion contacting the second clad layer in the step of forming the electrode.

Further preferably, stacked layers of titanium, platinum, and gold are formed as the above electrode so as to contact the second clad layer and contact layer from its titanium side in the step of forming the electrode.

Preferably, in a method of producing a laser diode according to the present invention, a thickness of the third clad layer is formed to be in a range of 0.1 to 0.7 μm.

Also preferably, a width of the current injection stripe region is formed to be in a range of 1.5 to 5 μm.

According to the above method of production of a laser diode of the present invention, a laser diode of a self pulsation type having excellent noise characteristics capable of reducing an operating current from that in the prior art whereby long term reliability is improved can be produced by less number of epitaxial steps than in the prior art at an improved production yield.

BRIEF DESCRIPTION OF THE DRAWINGS

These and other objects and features of the present invention will become clearer from the following description of the preferred embodiments given with reference to the accompanying drawings, in which:

FIG. 1A is a sectional view of a laser diode according to a first embodiment, while

FIGS. 5A and 5B are sectional views of a laser diode according to a second embodiment, while FIG. 5B is an enlarged sectional view of a region higher than an active layer in FIG. 5A;

FIG. 8A is perspective view of the configuration when a laser diode according to the second embodiment is mounted in a CAN package, while

FIG. 10A is perspective view of the configuration when a laser diode according to the second embodiment is mounted in a laser coupler, while

DESCRIPTION OF THE PREFERRED EMBODIMENTS

Below, embodiments of a laser diode and semiconductor light emitting device of the present invention will be explained with reference to the drawings.

First Embodiment

A laser diode according to the present embodiment is a laser diode LD for DVDs having a light emitting wavelength of 650 nm.

Figure 1A:
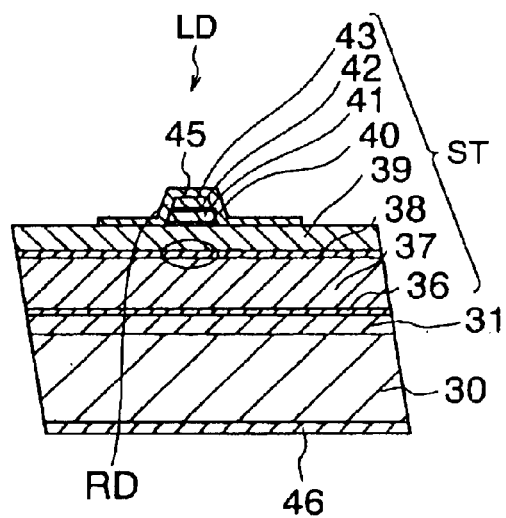
Figure 1B:
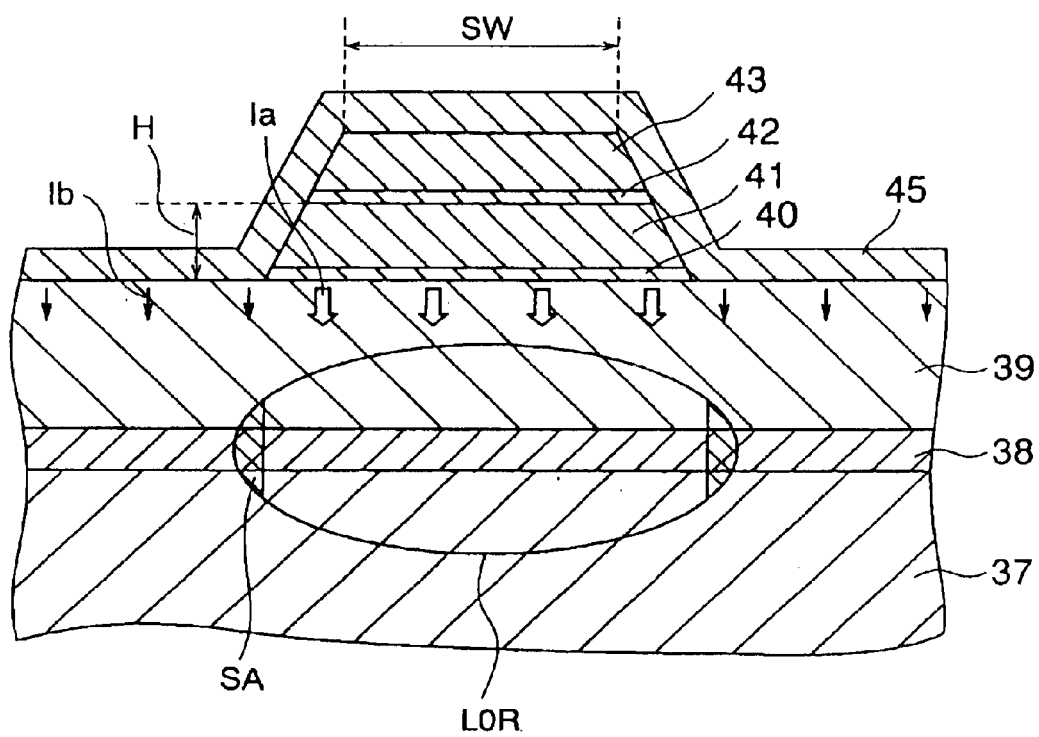
FIG. 1B is an enlarged sectional view of a region higher than an active layer in FIG. 1A.

FIG. 1A is a sectional view of the above laser diode, while FIG. 1B is an enlarged sectional view of a region higher than an active layer in FIG. 1A.

The above laser diode LD will be explained.

An n-type buffer layer 31 comprised for example of GaAs, an n-type buffer layer 36 comprised for example of InGaP, an n-type clad layer 37 comprised for example of AlGaInP, an active layer (multiquantum well structure of an oscillation wavelength of 650 nm, including a barrier layer and a guide layer) 38, and a p-type clad layer 39 comprised for example of AlGaInP are stacked on an n-type substrate 30. As further upper layers, an etching stop layer 40 comprised for example of GaInP, a p-type clad layer 41 comprised for example of AlGaInP, an interlayer 42 comprised for example of GaInP, and a p-type contact layer 43 comprised for example of GaAs are stacked to form a stack ST.

The layers from a surface of the p-type contact layer 43 to the etching stop layer 40 are processed to a ridge shape RD protruding above the p-type clad layer 39.

A p-electrode 45 is formed by covering the regions except for the current injection stripe region, that is, the p-type clad layer 39, and the p-type contact layer 43.

The p-electrode for example comprised of a Ti/Pt/Au stack and formed so that the Ti side contacts a semiconductor.

Also, below the n-type substrate 30 is formed an n-electrode 46 comprised for example of an AuGe/Ni/Au stack connected thereto.

In the laser diode of the present embodiment, when a predetermined voltage is applied to the p-electrode and n-electrode, at the time of injecting a first current Ia from the p-electrode 45 via the contact layer and emitting laser light from a laser light oscillation region LOR near the active layer 38, a second current Ib which is smaller than the first current Ia is injected in regions except for the current injection stripe region from the p-electrode 45 via the p-type clad layer 39, the current is suitably dispersed to end portions of the laser light oscillation region LOR, a saturatable absorption region SA is formed, and self pulsation is generated.

Also, the degree of self pulsation can be adjusted by the material of the p-electrode 45, the thickness H of the p-type clad layer 41, and the width SW of the current injection stripe region.

The degree of self pulsation is an amount dependent on an amount of current dispersed in the laser light oscillation region LOR from the p-type clad layer/p-electrode made by AlGaInP. The amount of current to be dispersed is determined by a work function of metal materials constituting the p-electrode.

In the present invention, Ti is preferable as a metal material contacting the p-type clad layer comprised of the above AlGaInP, Pt is preferable as a metal material contacting Ti, and Au is preferable as a metal material contacting Pt, namely, it is preferable that the above Ti/Pt/Au stack be formed so that the Ti side thereof contacts the semiconductor.

When the thickness H of the p-type clad layer 41 is small, the optical output where a kink appears is low (the kink level is low). This is because a $\Delta n$ (refractive index difference) of the laser oscillation region is small and the light of the oscillation region is unbalanced due to the injected current when the thickness H of the p-type clad layer 41 is small. To prevent the unbalance, the thickness H of the p-type clad layer 41 is set to be not less than a certain value and changes (movement) of the oscillation region (photoelectric field region) are prevented by securing the $\Delta n$.

Conversely, when the thickness H of the p-type clad layer 41 is large, the degree of self pulsation becomes weak. The degree of self pulsation is expressed by a coherence index $\gamma$. When the $\gamma$ value is small, a preferable self pulsation laser having a high degree of self pulsation is obtained, while when the thickness H of the p-type clad layer 41 is large, the $\Delta n$ becomes large as above and a laser diode of an index guide (refractive index waveguide) type is obtained.

Furthermore, when the thickness H of the p-type clad layer 41 is large, there arises a disadvantage that the horizontal direction emission angle $\theta//$ of the laser emission angle characteristic becomes small.

Regarding the above conditions, it is preferable to set the thickness H of the p-type clad layer 41 to be within a range of 0.1 to 0.7 $\mu$m so as to attain a suitable range of characteristics in the case of application to an optical pickup (kink level: 7 to 9 mW or more, $\gamma \leq 0.5$, 7 deg $\leq \theta// \leq 11$ deg).

Further, when the width SW of the current injection stripe region is small, the optical output at which a kink appears is small (the kink level is low).

Conversely, when the width SW of the current injection stripe region is large, the degree of self pulsation becomes weak. This is because when the width SW of the current injection stripe region is large, superimposition of the saturatable absorption region formed by the quantum well layer and the laser light oscillation region (photoelectric field region) becomes small and the waveguide loss becomes small.

Furthermore, when the width SW of the current injection stripe region is large, there arises an inconvenience that the laser emission angle characteristic of the horizontal direction emission angle θ// becomes small.

To make the above conditions fall within a range of characteristics suitable to the case of being applied to an optical pickup (kink level: 7 to 9 mW or more, γ≦0.5, 7 deg≦θ//≦11 deg), the width SW of the current injection stripe region is preferably within the range of 1.5 to 5 μm.

A self pulsation laser diode LD configured as above can reduce the operating current more than in the prior art, therefore the long term reliability can be improved.

Also, only one epitaxial step is needed for formation due to the configuration, so the number of epitaxial steps can be reduced from that in the prior art and the production yield can be improved.

A method of forming the above laser diode LD will be explained next.

Figure 2A:
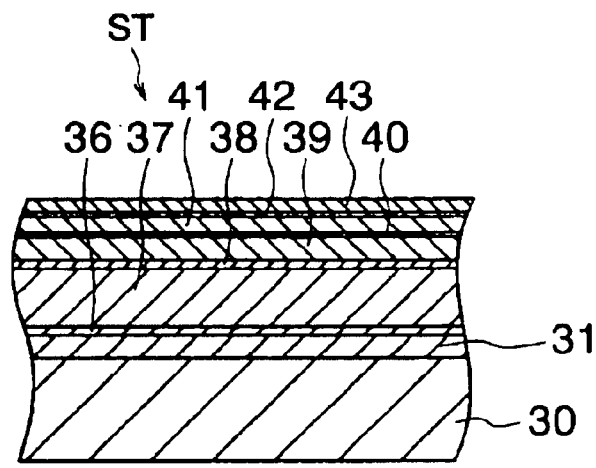
FIGS. 2A to 2C are sectional views of production steps in a method of production of a laser diode according to the first embodiment.

First, as shown in FIG. 2A, an n-type buffer layer 31 comprised for example of GaAs, an n-type buffer layer 36 comprised for example of InGaP, an n-type clad layer 37 comprised for example of AlGaInP, an active layer (multiquantum well structure having an oscillation wavelength of 650 nm, including a barrier layer and a guide layer) 38, a p-type clad layer 39 comprised for example of AlGaInP, an etching stop layer 40 comprised for example of GaInP, a p-type clad layer 41 comprised for example of AlGaInP, an interlayer 42 comprised for example of GaInP, and a p-type contact layer 43 comprised for example of GaAs are successively stacked on an n-type substrate 30 comprised for example of GaAs by an epitaxial growth method such as metal-organic vapor phase epitaxial growth (MOVPE).

Figure 2B:
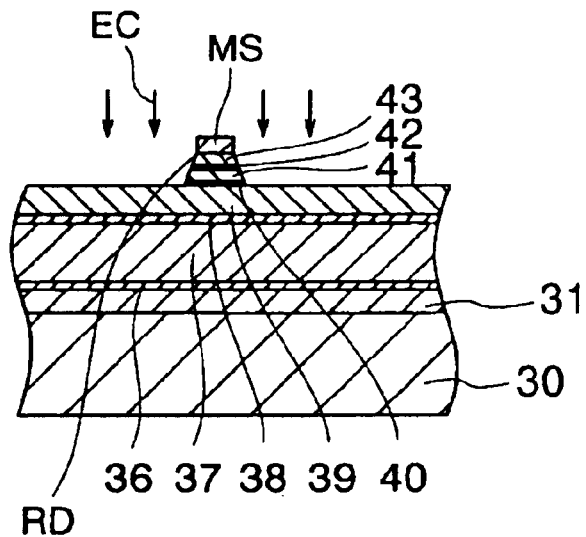
Figure 2C:
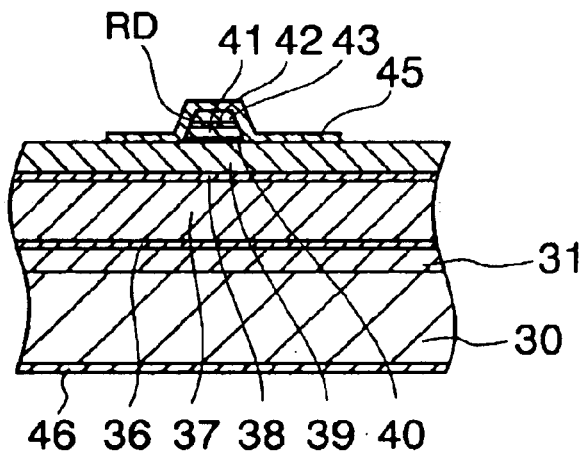

Next, as shown in FIG. 2B, a mask layer MS for protecting a current injection region is formed by photolithography.

Next, while protecting the portion to form the current injection stripe region by using the mask layer MS as a mask, etching EC is performed by using the etching stop layer 40 as an etching stop to remove regions other than the current injection stripe region from the p-type contact layer 43 to the p-type clad layer 41 and to form a ridge shape RD wherein the current injection region protrudes out. Furthermore, etching is performed under different etching conditions to remove the etching stop layer 40 in the regions other than the current injection stripe region.

Next, the mask layer MS is removed by processing by an organic solvent etc., then a p-electrode 45, such as Ti/Pt/Au, is formed so as to be connected to the p-type contact layer 43 and the p-type clad layer 39 exposed at portions other than the current injection stripe region, while an n-electrode 46, such as AuGe/Ni/Au, is formed so as to be connected to the n-type substrate 30.

Then, after pelletizing, a laser diode LD as shown in FIGS. 1A and 1B may be obtained.

According to the method of production of a laser diode of the present embodiment, only one epitaxial step is needed for forming a laser diode of the self pulsation type which is capable of reducing the operating current from that in the prior art and thereby improving the long term reliability, so the number of epitaxial steps is reduced and production at an improved production yield is possible.

EXAMPLE 1

In a laser diode of the above configuration, the dependency of the coherence index γ, horizontal direction emission angle θ//(deg), and level (mW) where a kink appears (kink level) on the thickness H of the p-type clad layer 41 are investigated.

Figure 3A:
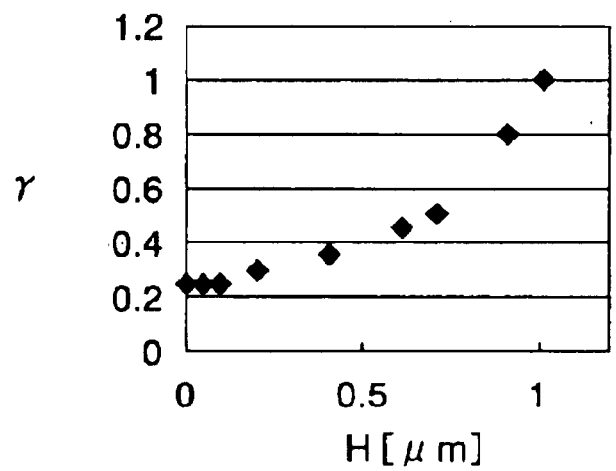
FIGS. 3A to 3C are views plotting a (3A) coherence index γ, (3B) horizontal direction emission angle θ//(deg), and (3C) level (mV) where a kink appears with respect to a thickness H of a p-type clad layer in a first example.
Figure 3B:
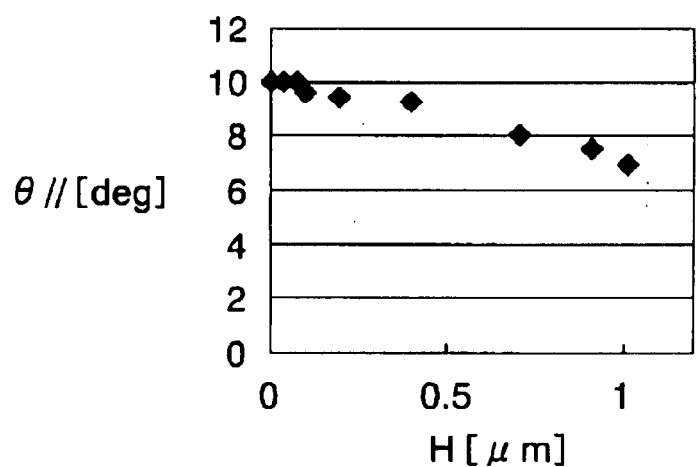
Figure 3C:
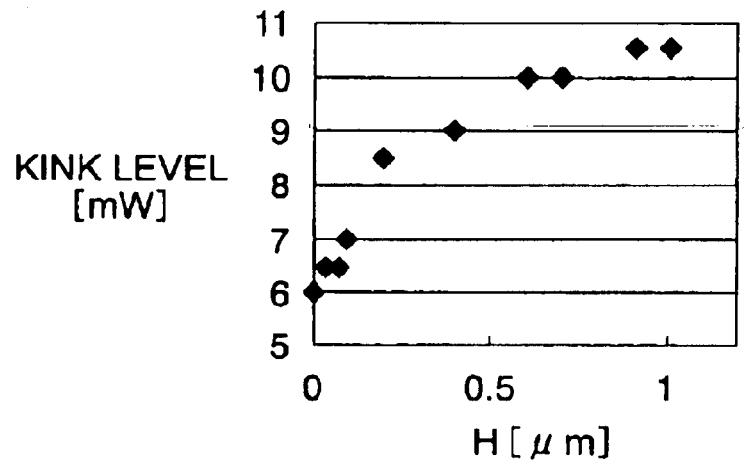

A view of the obtained results is shown in FIGS. 3A to 3c. In FIGS. 3A to 3c, the (3A) coherence index γ, (3B) horizontal direction emission angle θ//(deg), and (3C) level where a kink appears (mW) are plotted with respect to the thickness H of the p-type clad layer 41.

It was confirmed that by setting the thickness H of the p-type clad layer 41 within a range of 0.1 to 0.7 μm, it was possible to obtain a range of characteristics suitable for application to an optical pickup (kink level: 7 to 9 mW or more, γ≦0.5, 7 deg≦θ//≦11 deg) for the above conditions.

EXAMPLE 2

In a laser diode of the above configuration, the dependency of the coherence index γ, horizontal direction emission angle θ//(deg), and level (mW) where a kink appears (kink level) on the width SW of the current injection stripe region are investigated.

Figure 4A:
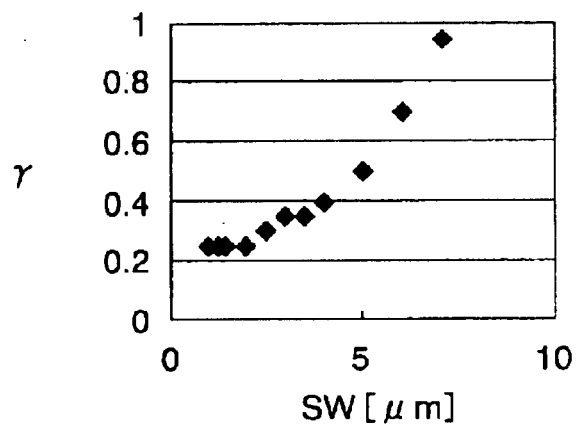
FIGS. 4A to 4C are views plotting a (4A) coherence index γ, (4B) horizontal direction emission angle θ//(deg), and (4C) level (mV) where a kink appears with respect to a width SW of a current injection stripe region in a second example.
Figure 4B:
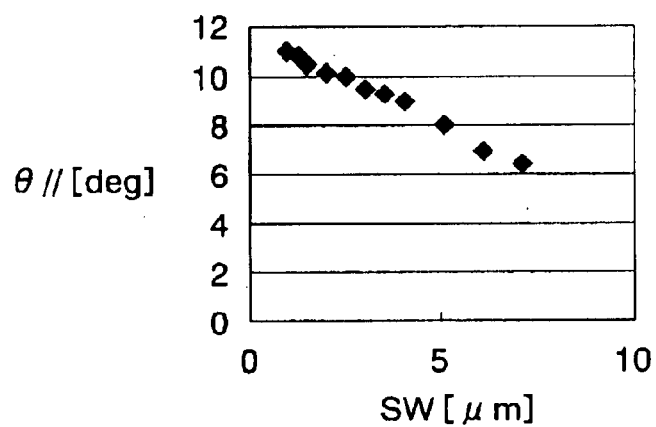
Figure 4C:
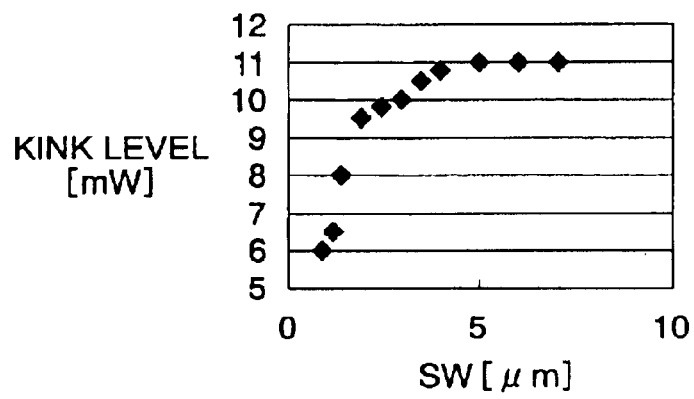

A view of the obtained results is shown in FIGS. 4A to 4C. In FIGS. 4A to 4C, the (4A) coherence index γ, (4B) horizontal direction emission angle θ//(deg), and (4C) level where a kink appears (mW) are plotted with respect to the width SW of the current injection stripe region.

It was confirmed that by setting the width SW of the current injection stripe region within a range of 1.5 to 5 μm, it was possible to obtain a range of characteristics suitable for application to an optical pickup (kink level: 7 to 9 mW or more, γ≦0.5, 7 deg≦θ//≦11 deg) for the above conditions.

EXAMPLE 3

In the above Example 1 and Example 2, a self pulsation laser diode formed by setting the thickness H of the p-type clad layer 41 within a range of 0.1 to 0.7 μm and the width SW of the current injection stripe region 1.5 to 5 μm had an operating current of 40 to 45 mA at an output of 5 mW and a room temperature of 25° C., that is, the operating current could be reduced from that in a self pulsation laser diode of the prior art, and long term reliability could be improved.

Second Embodiment

A semiconductor light emitting device according to the present embodiment is a monolithic laser diode wherein a laser diode LD1 for CDs (light emission wavelength of 780 nm) and a laser diode LD2 for DVDs (light emission wavelength of 650 nm) are mounted on one chip and is a semiconductor light emitting device suitable for a compatible optical pickup capable of playing back CDs and DVDs.

Figure 5A:
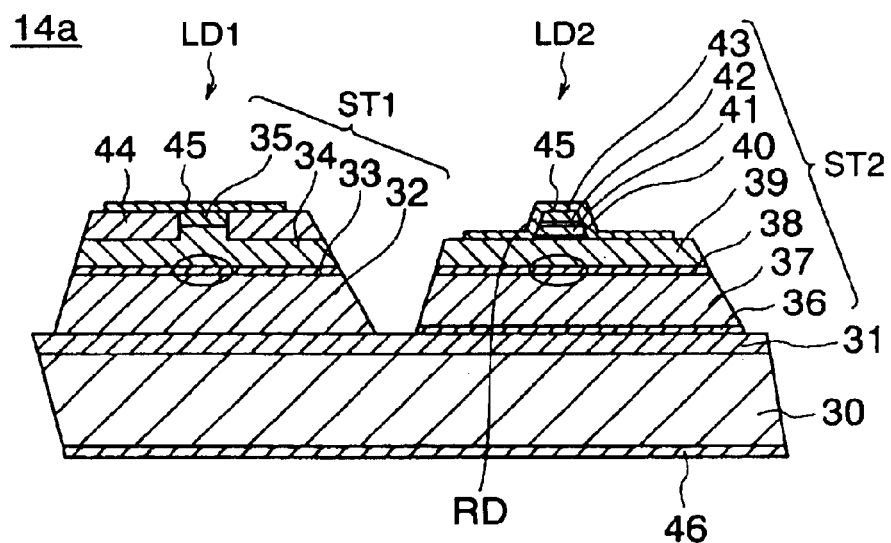
Figure 5B:
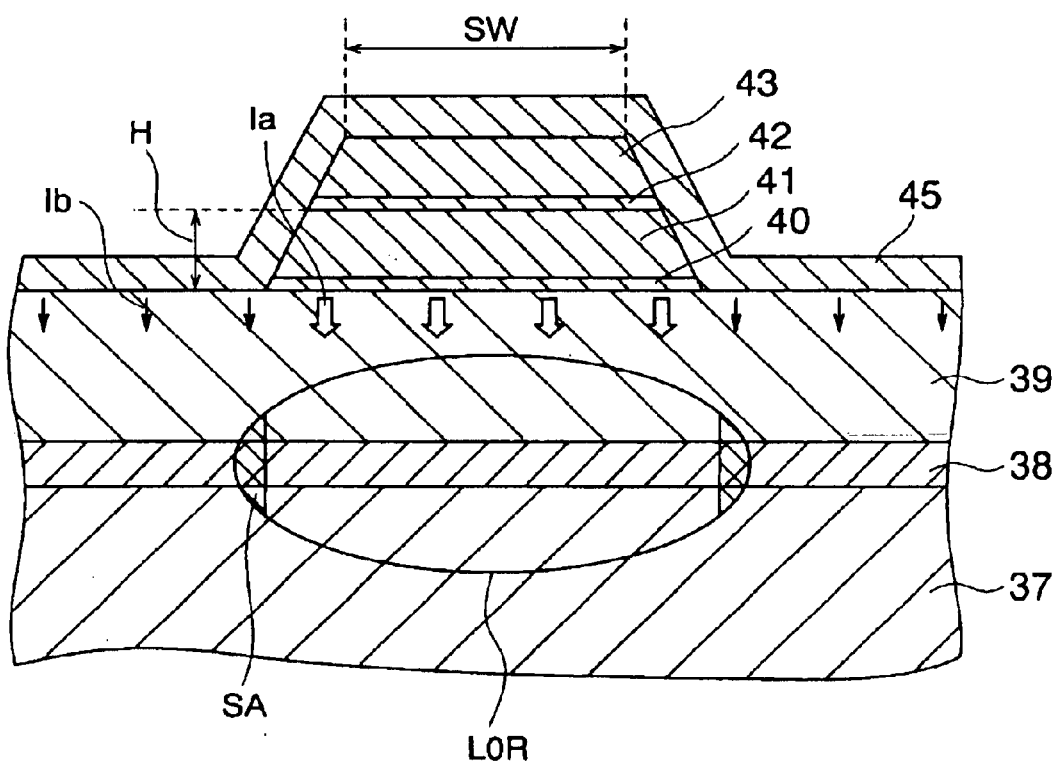

FIG. 5A is a sectional view of the above monolithic laser diode, and FIG. 5B is an enlarged sectional view of a portion of upper layers of the active layer of the second laser diode LD2.

The above monolithic laser diode 14a will be explained next.

As a first laser diode LD1, an n-type buffer layer 31 comprised for example of GaAs, an n-type clad layer 32 comprised for example of AlGaAs, an active layer (multiquantum well structure having an oscillation wavelength of 780 nm) 33, a p-type clad layer 34 comprised for example of AlGaAs, and a p-type cap layer 35 comprised for example of GaAs are stacked on an n-type substrate 30 comprised for example of GaAs so as to form a first stack ST1. A stripe is formed by a region 44 being insulated from a surface of the p-type cap layer 35 to a middle of the p-type clad layer 34 and has a current narrowing structure.

On the other hand, as a second laser diode LD2, an n-type buffer layer 31 comprised for example of GaAs, an n-type buffer layer 36 comprised for example of InGaP, an n-type clad layer 37 comprised for example of AsGaInP, an active layer (multiquantum well structure having an oscillation wavelength of 650 nm, including a barrier layer and a guide layer) 38, and a p-type clad layer 39 comprised for example of AlGaInP are stacked on an n-type substrate 30. As further upper layers, in a current injection stripe region, an etching stop layer 40 comprised for example of GaInP, a p-type clad layer 41 comprised for example of AlGaInP, an interlayer 42 comprised for example of GaInP, and a p-type contact layer 43 comprised for example of GaAs are stacked so that a second stack ST2 is formed.

Layers from a surface of the p-type contact layer 43 to the etching stop layer 40 are processed to a ridge shape RD protruding out on the p-type clad layer 39.

In the first stack ST1, a p-electrode 45 is formed connected to the p-type cap layer 35.

On the other hand, in the second stack ST2, a p-electrode 45 is formed by covering the regions other than a current injection stripe region, that is, the p-type clad layer 39, and p-type contact layer 43.

The p-electrode is comprised for example of a Ti/Pt/Au stack and formed so that the Ti side contacts a semiconductor.

Also, an n-electrode 46 comprised for example of AuGe/Ni/Au stack is formed under the n-type substrate 30 connected thereto.

In the monolithic laser diode 14a having the above configuration, the distance between a laser light emitting portion of the first laser diode LD1 and a laser light emitting portion of the second laser diode LD2 is set to be within a range of for example about 200 $\mu$m or less (about 100 $\mu$m). Laser light L1 having a wavelength of for example the 780 nm band and laser light L2 having a wavelength of the 650 nm band are emitted in parallel with the substrate and substantially in the same direction (substantially parallel) from the respective laser light emitting portions.

The laser diode 14a configured as above is a monolithic laser diode wherein two kinds of laser diodes having different light emitting wavelengths are mounted on one chip and is suitable for an optical pickup of an CD or DVD or other different wavelength optical disk systems.

In the above monolithic laser diode of the present embodiment, when a predetermined voltage is applied to the p-electrode and n-electrode of the second laser diode LD2 for emitting a laser beam of a 650 nm band, a first current Ia is injected from the p-electrode via the contact layer and a laser beam is emitted from the laser beam oscillation region LOR near the active layer 38. At that time, in the regions other than the current injection stripe region, a second current Ib which is smaller than the first current Ia is injected from the p-electrode via the p-type clad layer 39. The current is suitably dispersed to end portions of the laser beam oscillation region LOR, a saturable absorption region SA is formed, and self pulsation occurs.

Also, in the above second laser diode LD2, the degree of the self pulsation can be adjusted by the material of the p-electrode 45, the thickness H of the p-type clad layer 41, and the width SW of the current injection stripe region.

For example, to satisfy characteristics such as the strength of the self pulsation, kink level, and emission angle characteristics, in the same way as in the first embodiment, it is preferable from the work function of metals, that as the material of the p-electrode 45, the above Ti/Pt/Au stack be formed so that the Ti side contacts the semiconductor. Further, it is preferable that the thickness H of the p-type clad layer 41 be in the region of 0.1 to 0.7 $\mu$m and the width SW of the current injection stripe region be in the range of 1.5 to 5 $\mu$m.

The self pulsation second laser diode having the above configuration is capable of reducing the operating current compared with that in the prior art and thereby can be improved in the long term reliability.

Also, only one epitaxial step is necessary for forming the second laser diode LD2 portion, so the number of the epitaxial steps can be reduced from that in the prior art and improved production yield becomes possible.

A method of forming a monolithic laser diode 14a wherein the above first laser diode LD1 and second laser diode LD2 are mounted on one chip will be explained next.

Figure 6A:
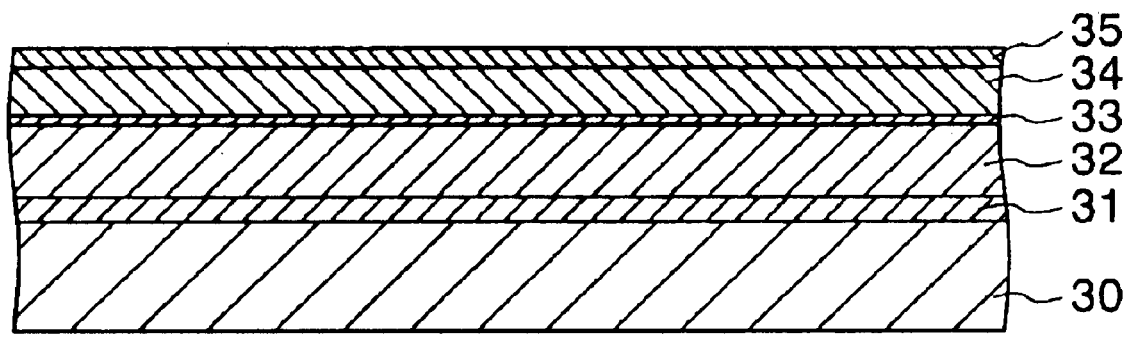
FIGS. 6A to 6L are sectional views of production steps of a method of production of a laser diode according to the second embodiment.

First, as shown in FIG. 6A, an n-type buffer layer 31 comprised for example of GaAs, an n-type clad layer 32 comprised for example of AlGaAs, an active layer 33 (a multiquantum well structure having an oscillation wavelength of 780 nm) 323, a p-type clad layer comprised for example of AlGaAs, and a p-type cap layer 35 comprised for example of GaAs are successively stacked on an n-type substrate 30 comprised for example of GaAs by an epitaxial growth method such as metal-organic vapor phase epitaxial growth (MOVPE).

Figure 6B:
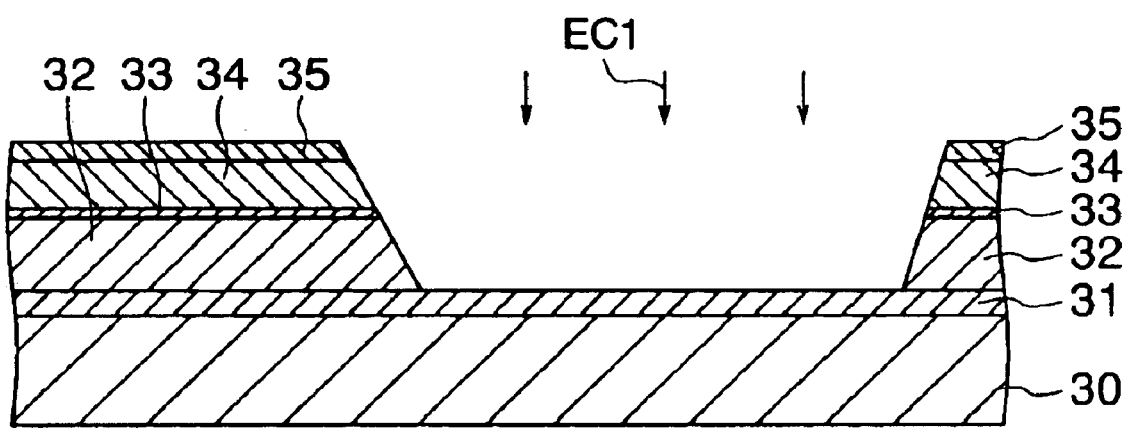

Next, as shown in FIG. 6B, while protecting the region to be left as the first laser diode LD1 by a not shown resist film, sulfuric acid based nonselective etchhing and fluoric acid-based AlGaAs selective etching or other wet etching (EC1) is used to remove the above stack in regions other than the first laser diode LD1 region up to the n-type clad layer 32.

Figure 6C:
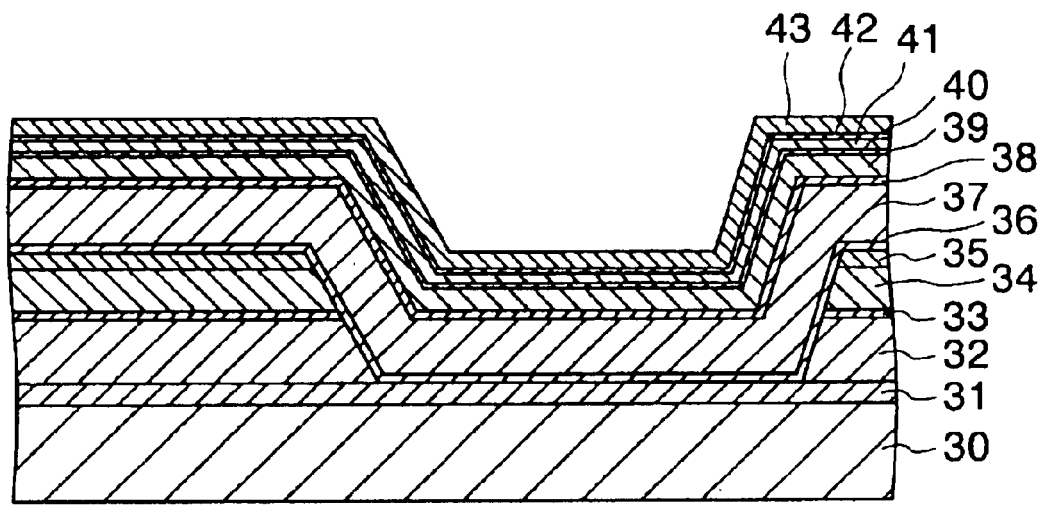

Next, as shown in FIG. 6C, an epitaxial growth method such as metal organic vapor phase epitaxial growth (MOVPE) is used to successively stacked on an n-type buffer layer 31 an n-type buffer layer 36 comprised for example of InGaP, an n-type clad layer 37 comprised for example of AlGaInP, an active layer (a multiquantum well structure having an oscillation wavelength of 650 nm, including a barrier layer and a guide layer) 38, a p-type clad layer 39 comprised for example of AlGaInP, an etching stop layer 40 comprised for example of GaInP, a p-type clad layer 41 comprised for example of AlGaInP, an interlayer 42 comprised for example of GaInP, and a p-type contact layer 43 comprised for example of GaAs.

Figure 6D:
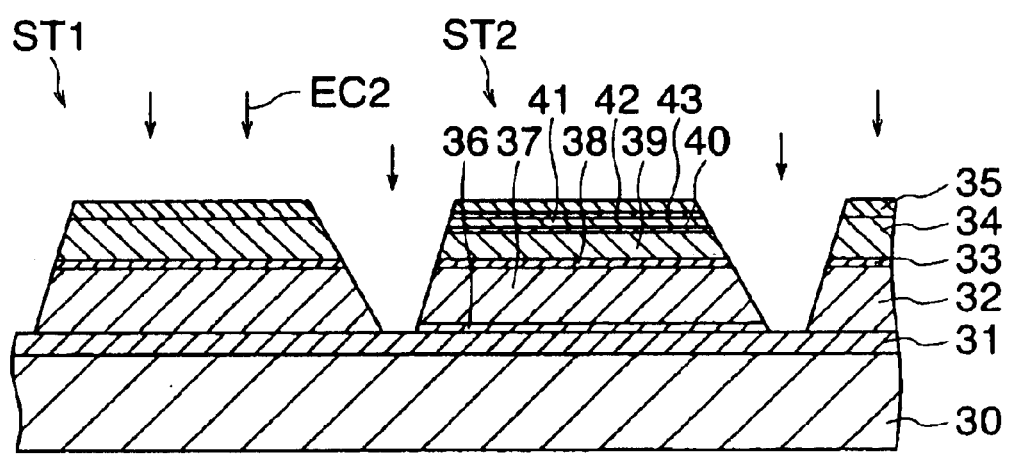

Next, as shown in FIG. 6D, while protecting the region to be left as the second laser diode LD2 by a not shown resist film, sulfuric acid based cap etching, phosphoric acid and hydrochloric acid based four elements selective etching, hydrochloric acid based separation etching, or other wet etching (EC2) is used to remove the above stack in regions other than the second laser diode LD2 region up to the n-type buffer layer 36 and to separate a first stack ST1 for the first laser diode and a second stack ST2 for the second laser diode.

Figure 6E:
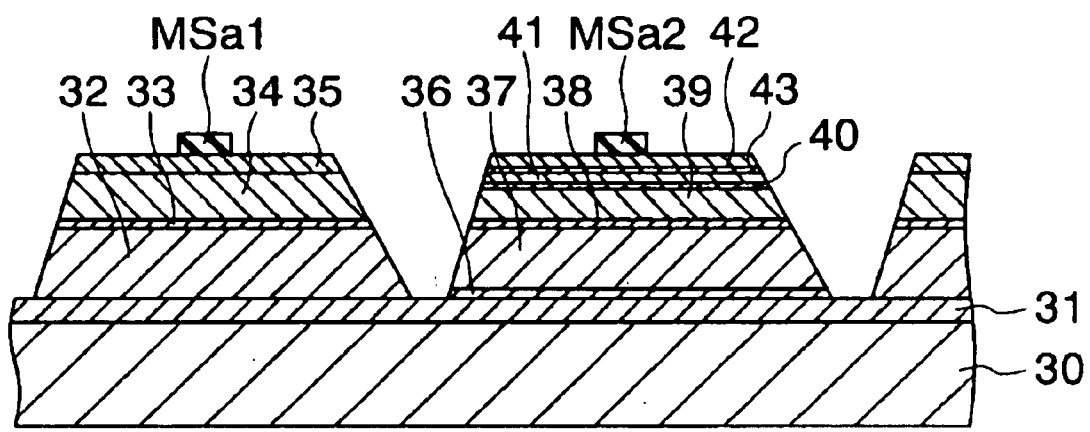

Next, as shown in FIG. 6E, a photolithography step of coating a resist film over the entire surface, exposing it through a mask pattern, curing the exposed portions of the resist film, and removing the not exposed portions of the resist film by an organic solvent such as acetone is used to form a first mask layer MSa1 for protecting the current injection region of the first stack ST1 and a second mask layer MSa2 for protecting the current injection region of the second stack ST2 over the first stack ST1 and the second stack ST2.

Figure 6F:
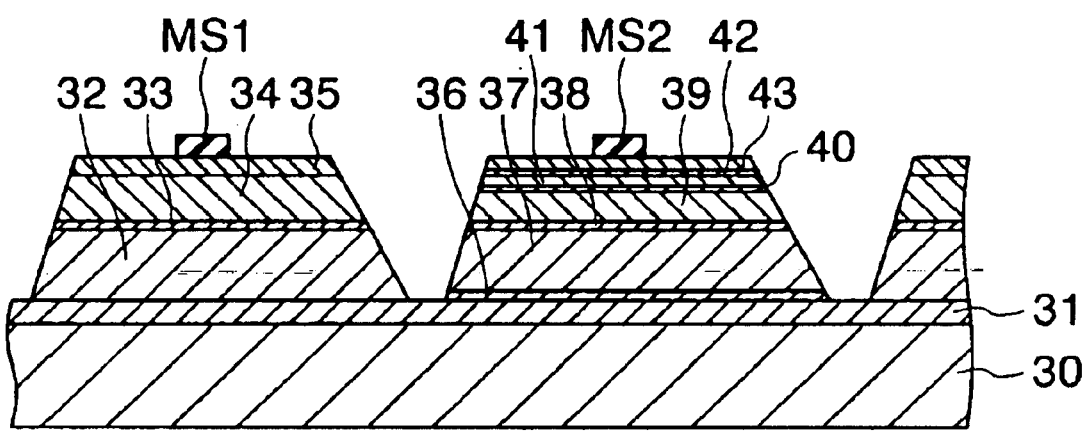

Next, as shown in FIG. 6F, the surface is cured by a chemical such as $CF_4$ or monochlorobenzene or by hard baking to obtain a first mask layer MS1 and a second mask layer MS2.

Figure 6G:
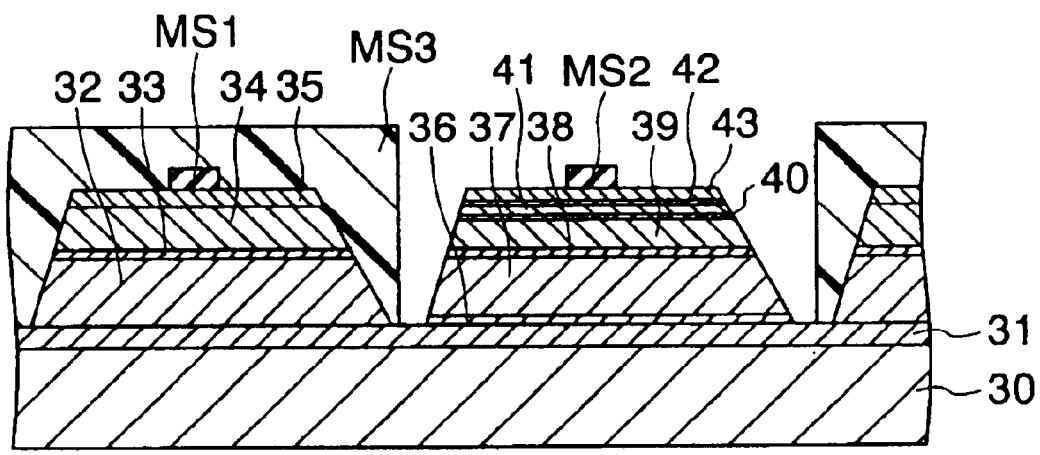

Next, as shown in FIG. 6G, a third mask layer MS3 is formed for protecting the entire first stack ST1 and opening a hole in the second stack ST2 by a photolithography step similar to the above.

Figure 6H:
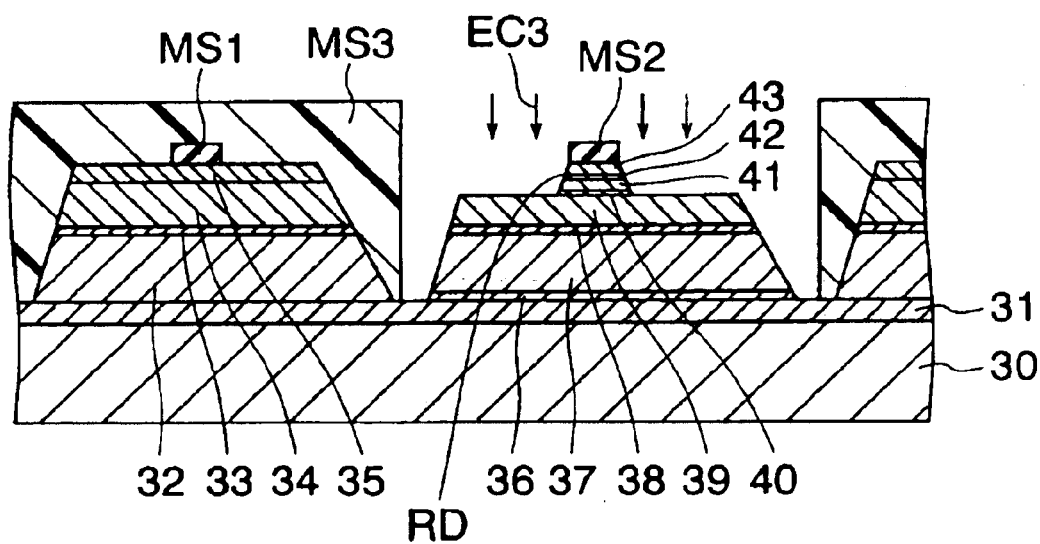

Next, as shown in FIG. 6H, while using the second mask layer MS2 and the third mask layer MS3 as masks and protecting the portion to form the current injection stripe region of the second stack ST2, etching EC3 is performed using the etching stop layer 40 as an etching stop to remove regions other than the current injection stripe region from the p-type contact layer 43 up to the p-type clad layer 41 so as to form a ridge shape RD wherein the current injection region protrudes out. Furthermore, the etching conditions are changed and etching performed to remove the etching stop layer 40 in regions other than the current injection stripe region.

Figure 6I:
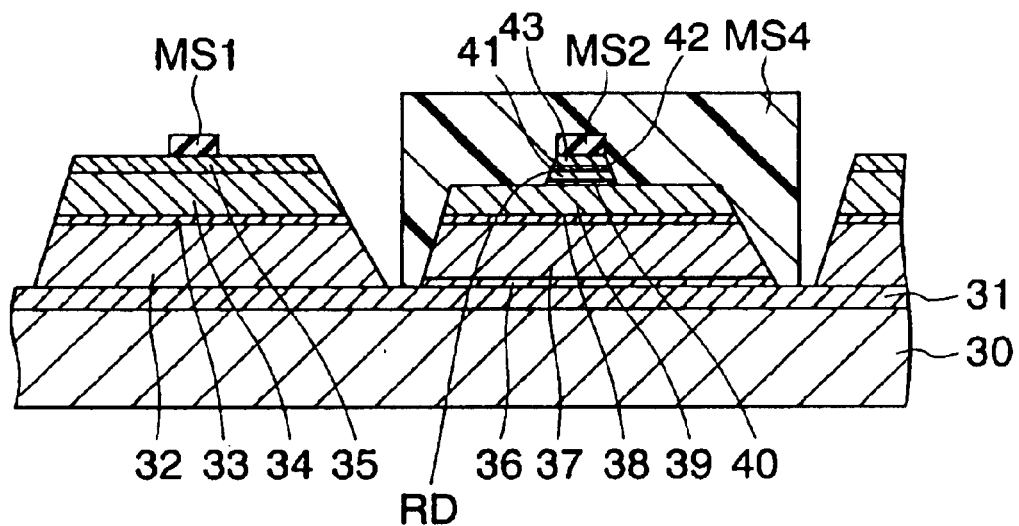

Next, as shown in FIG. 6I, the third mask layer MS3 is removed by processing by an organic solvent etc. At this time, the processing is made one which does not remove the first mask layer MS1 and second mask layer MS2.

Since the first mask layer and the second mask layer are formed by a resist film treated to cure its surface, it is possible to easily remove the third mask layer ST3 while leaving the first mask layer ST1 for forming a current narrowing structure of the first stack ST1 for forming a first laser diode in the following processing.

Next, a fourth mask layer MS4 for protecting the overall second stack ST2 and opening a hole in the first stack ST1 is formed by a photolithography step similar to the step of forming the third mask layer.

Figure 6J:
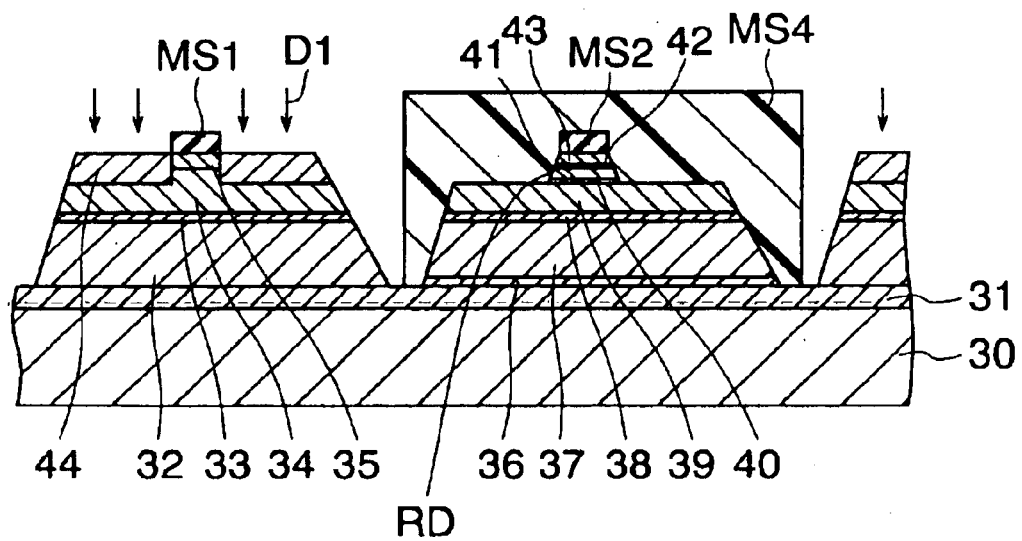

Next, as shown in FIG. 6J using the first mask layer and the fourth mask layer ST4 as masks, an impurity D1 is introduced by ion implantation in regions other than the portion for forming the current injection region of the first stack ST1 to form a region 44 insulated from a surface of the p-type cap layer 35 to the p-type clad layer 34 so as to obtain a stripe for forming a gain guide type current narrowing structure.

Figure 6K:
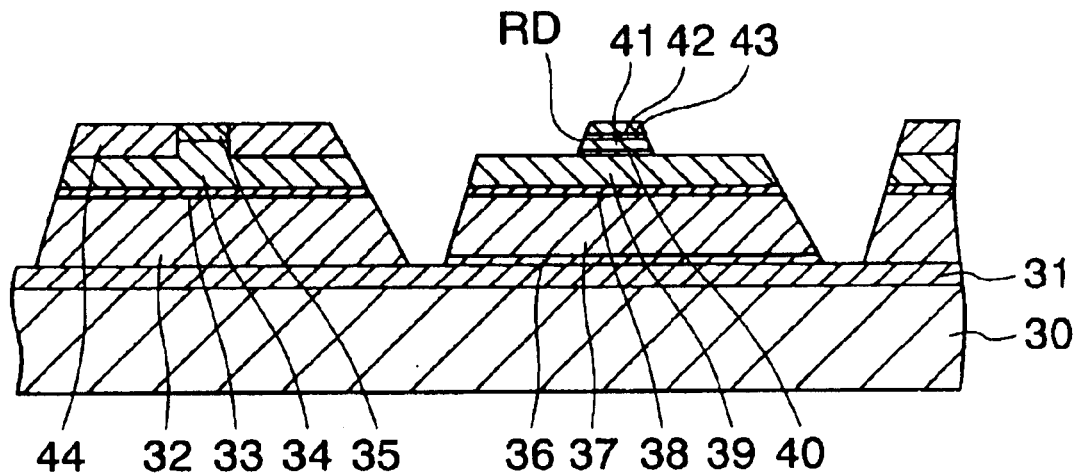

Next, as shown in FIG. 6K, the fourth mask layer MS4, first mask layer MS1, and second mask layer MS2 are removed by processing by an organic solvent, ashing, etc.

Figure 6L:
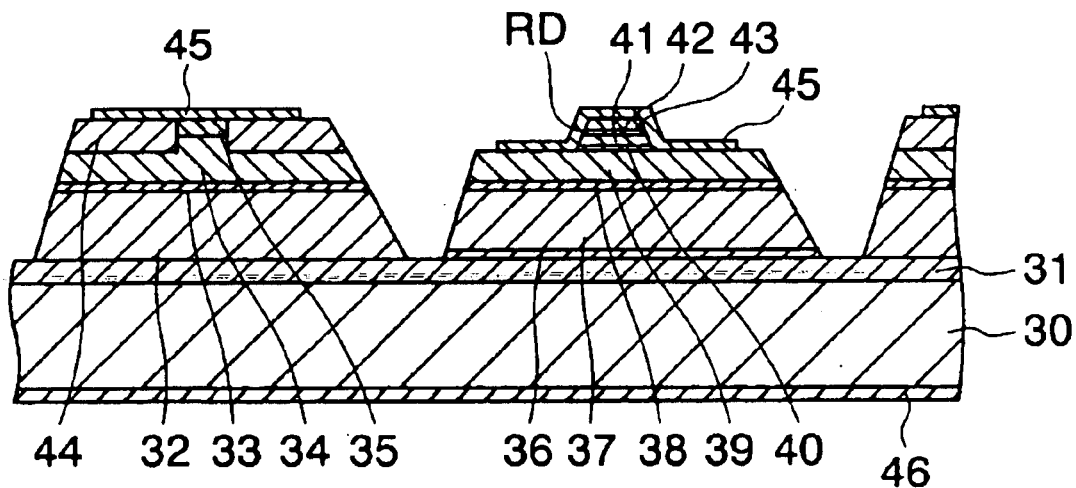

Next, as shown in FIG. 6L, a Ti/Pt/Au or other p-electrode 45 is formed so as to connect to the p-type cap layer 35 in the first stack ST1 and to connect to the p-type contact layer 43 and the p-type clad layer 39 exposed at portions other than the current injection stripe region in the second stack ST2.

On the other hand, an AuGe/Ni/Au or other n-electrode 4, is formed so as to connect to the n-type substrate 30.

After this, after pelletizing, a desired monolithic laser diode 14a as shown in FIGS. 5A and 5B, comprised of a first laser diode LD1 and second laser diode LD2 mounted on one chip, can be obtained.

Since the monolithic laser diode of the present embodiment is formed with for example two laser diodes separated from each other, it is possible to select elements suitable for the respective laser diodes from the group of elements comprised of Al, Ga, In, P, As, etc. Furthermore, the n-type substrate 30 for mounting the two semiconductor light emitting elements can be suitably selected from substrates containing compounds selected from a group of compounds comprised of GaAs, GaAsP, GaP, and InP.

According to the method of production of a monolithic laser diode of the present invention, only one epitaxial step is required for forming a second laser diode LD2 portion of a self pulsation type which is capable of reducing an operating current from that in the prior art and thereby improving the long term reliability. This enables the number of the epitaxial steps to be reduced from the past and enables production while improving the production yield.

Figure 7:
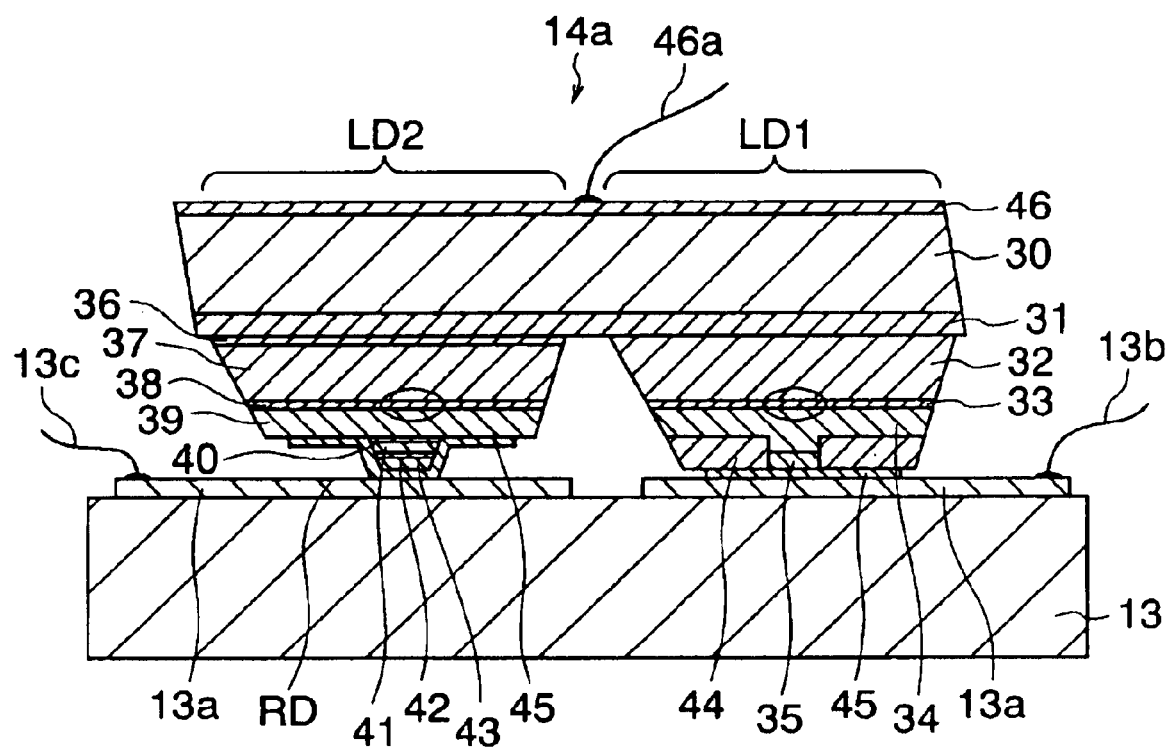
FIG. 7 is a sectional view of an example of using a laser diode according to the second embodiment.

The above monolithic laser diode 14a is, for example as shown in FIG. 7, used by being connected and fixed by soldering etc. to an electrode 13a formed on a semiconductor block 13 from the p-electrode 45 side.

In this case, for example, voltage is applied to the electrode 13a for connecting the p-electrode 45 of the first laser diode LD1 by a lead 13b, to the electrode 13a for connecting the p-electrode 45 of the second laser diode LD2 by a lead 13c, and to the n-electrode 46 common to the two laser diodes (LD1 and LD2) by a lead 46a.

Figure 8A:
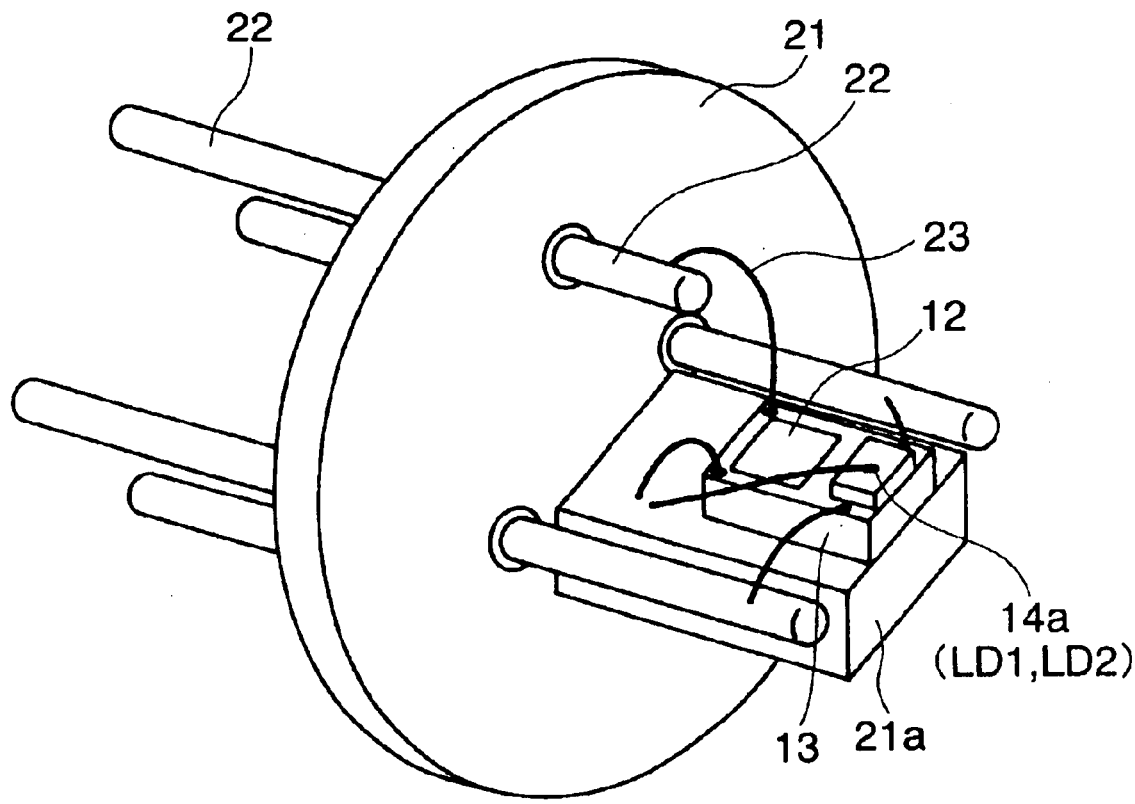

FIG. 8A is a perspective view of an example of the configuration when mounting the above monolithic laser diode 14a in a CAN package.

For example, a semiconductor block 13 wherein a PIN diode 12 is formed as a monitoring use optical detection element is fixed on a protruding portion 21a provided on a disk-shaped base 21. The monolithic laser diode 14a comprised of the first and second laser diodes (LD1 and LD2) mounted on one chip is arranged on top of that.

Furthermore, a terminal 22 is provided passing through the base 1 and connected by a lead 23 to the above first and second laser diodes (LD1 and LD2) or to the PIN diode 12. A drive power is supplied to the respective diodes.

Figure 8B:
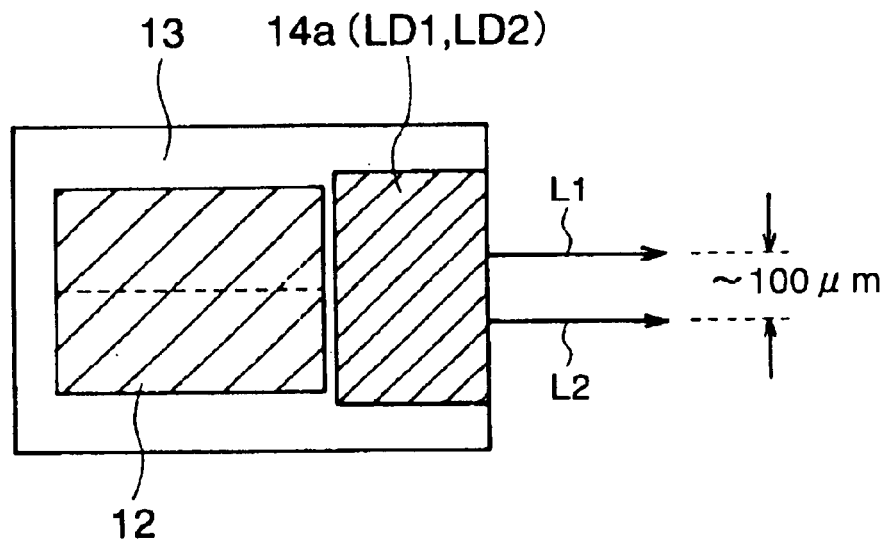
FIG. 8B is a plan view of a key portion thereof.

FIG. 8B is a plan view from a direction perpendicular to an emission direction of laser light of a CAN package laser diode.

The laser diode 14a comprised of the first laser diode LD1 and the second laser diode LD2 mounted on one chip is arranged over the semiconductor block 13 formed with the PIN diode 12.

The PIN diode 12 is configured to sense laser lights emitted to a rear side of the first and second laser diodes (LD1 and LD2), measure their strengths, and control the drive currents of the first and second laser diodes (LD1 and LD2) so that the strengths of the laser lights become constant, that is, for APC (automatic power control).

Figure 9:
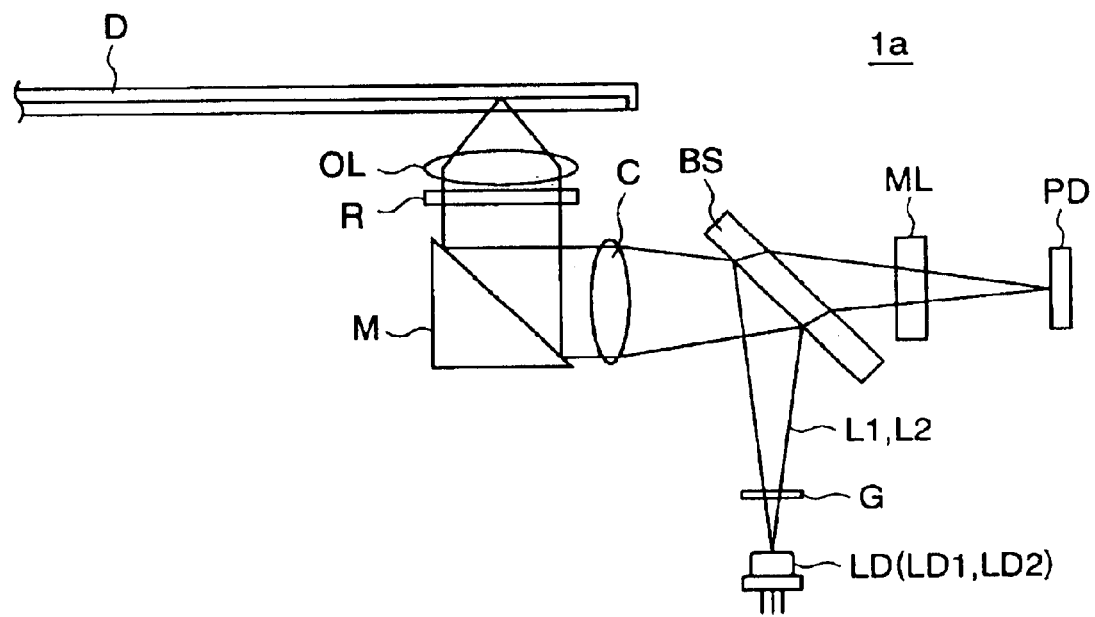
FIG. 9 is a schematic view of the configuration of an optical pickup using a CAN packaged laser diode of FIGS. 8A and 8B.

FIG. 9 is a schematic view of the configuration when configuring an optical pickup for CD or DVD or other optical systems of different wavelengths by using a laser diode LD comprised of a CAN packaged monolithic laser diode comprised of a laser diode LD1 and second laser diode LD2 mounted on one chip.

The optical pickup 1a has mutually separate, that is, discretely configured, optical systems wherein a monolithic laser diode LD comprised of a first laser diode LD1 for emitting laser light of 780 nm and a second laser diode LD2 for emitting laser light of 650 nm mounted on one chip, a grating G for the 780 nm band which passes the 650 nm band, a beam splitter BS, a collimater C, a mirror M, a CD use aperture R for limiting an opening, an object lens OL, a multilens ML, and a photo diode PD are provided at respectively predetermined positions. The photo diode PD is comprised for example of a first photo diode for receiving light of a 780 nm band and a second photo diode for receiving light of a 650 nm band formed adjacent to each other in parallel.

In the optical pickup 1a having the above configuration, first laser light L1 from the first laser diode LD1 passes through the grating G, is partially reflected by the beam splitter BS, passes through or is reflected at the collimater C, mirror M, and CD use aperture R for limiting an opening, and is condensed on an optical disk D by the object lens OL.

The light reflected from the optical disk D passes through the multilens ML via the object lens OL, CD use aperture R for limiting the opening, mirror M, collimater C, and beam splitter BS and is projected on the photo diode PD (first photo diode). Information written on a recording surface of the CD or other optical disk D is read by the change of the reflected light.

In the optical pickup 1a having the above configuration, second laser light L2 from the second laser diode LD2 is also condensed on the optical disk D by the same path as above. The reflected light is projected on the photo diode PD (second photo diode). Information written on a recording surface of a DVD or other optical disk D is read by the change of this reflected light.

According to the above optical pickup 1a, a laser diode for CDs and a laser diode for DVDs are mounted and lights reflected therefrom are focused on a photo diode for CDs or a photo diode for DVDs by a common optical system so as to enable CDs and DVDs to be played back.

Also, it is possible to configure a laser coupler suitable for an optical pickup for recording and playback of a CD, DVD, or other optical storage medium by emission of light using the monolithic laser diode according to the present embodiment comprised of a first laser diode LD1 and second laser diode LD2 mounted on one chip.

Figure 10A:
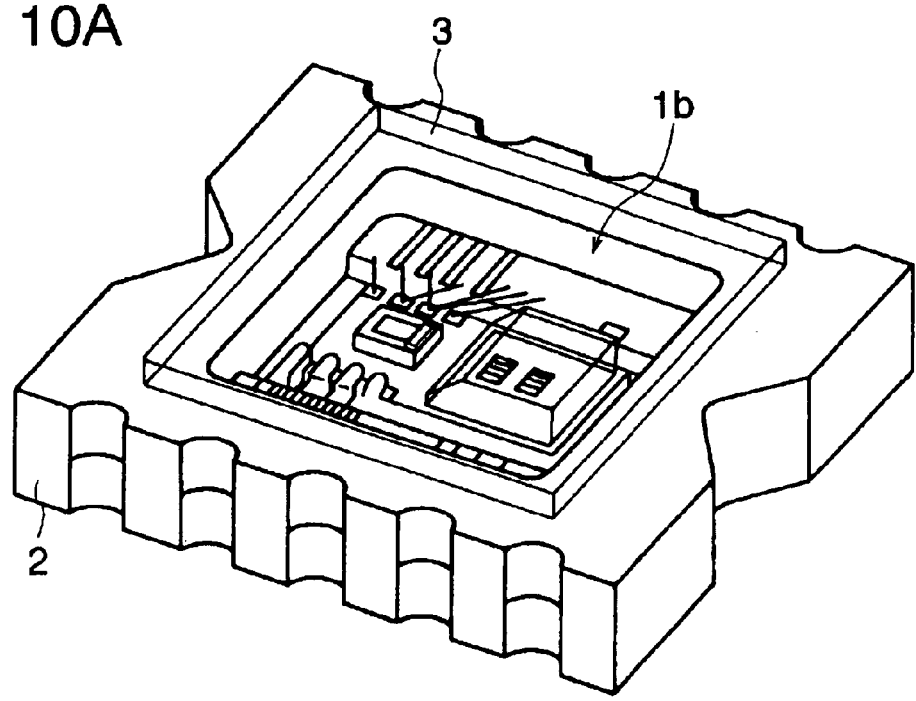

FIG. 10A is a view for explaining the schematic configuration of the above laser coupler 1b. The laser coupler 1b is loaded in a recess of a first package member 2 and sealed by a glass or other transparent second package member 3.

Figure 10B:
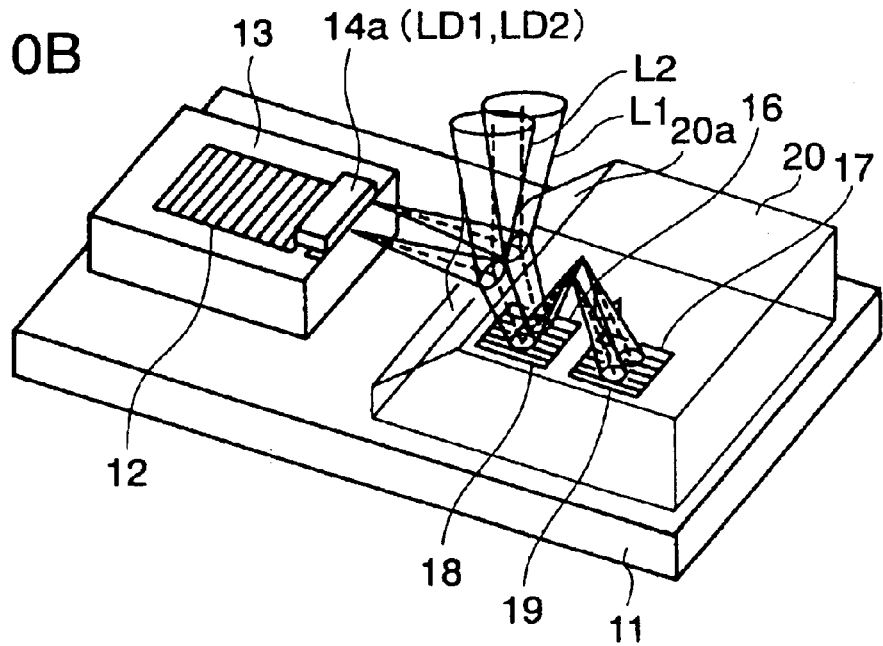
FIG. 10B is a perspective view of a key portion thereof.

FIG. 10B is a perspective view of a key portion of the above laser coupler 1b.

For example, a semiconductor block 13 formed with a PIN diode 12 as a monitoring use optical detection element is arranged on an integrated circuit substrate 11 made by cutting out a silicon monocrystal. Furthermore, the monolithic laser diode 14a comprised of a first laser diode LD1 and second laser diode LD2 as light emitting elements mounted on one chip is arranged on the semiconductor block 13.

On the other hand, the integrated circuit substrate 11 is formed with for example first photo diodes (16, 17) and second photo diodes (18, 19). A prism 20 is mounted on the first and second photo diodes (16, 17, 18, 19) a predetermined distance from the first and second laser diodes (LD1 and LD2).

Laser light L1 emitted from the first laser diodes LD1 is partially reflected at a light splitting face 20a of the prism 20 to be bent in its direction of advance, is emitted in an emission direction from an emission window formed in the second package member 3, and is focused on an optical disk (CD) or other object via a not shown reflection mirror, object lens, etc.

The light reflected from the above object proceeds in an opposite direction to the direction striking the object and strikes the light splitting face 20a of the prism 20 from the emission direction from the laser coupler 1b. While focusing on the upper surface of the prism 20, it strikes the front first photo diode 16 and the rear first photo diode 17 formed on the integrated circuit substrate 11 forming the lower surface of the prism 20.

On the other hand, the laser light L2 emitted from the second laser diode LD2 is partially reflected at the light splitting face 20a of the prism 20 to be bent in direction of advance, is emitted in an emission direction from the emission window formed in the second package, and is focused on an optical disk (DVD) or other object via a not illustrated reflection mirror, object lens, etc.

The light reflected from the above object proceeds in an opposite direction to the direction striking the object and strikes the light splitting face 20a of the prism 20. While focusing on the upper surface of the prism 20, the light strikes the front second photo diode 18 and rear second photo diode 19 formed on the integrated circuit substrate 11 forming the lower surface of the prism 20.

Also, the PIN diode 12 formed on the semiconductor block 13 has a region for example divided into two, senses laser lights of the first and second laser diodes (LD1 and LD2) emitted on the rear side, respectively, measures strengths of the laser lights, and controls the drive currents of the first and second laser diodes (LD1 and LD2) so that the strengths of the laser lights become constant, that is, for APC control.

The distance between a laser light emission portion of the above first laser diode LD1 and a laser light emission portion of the second laser diode LD2 is set to be within a range of for example about 200 $\mu$m or less (about 100 $\mu$m). Laser light L1 having a wavelength of for example the 780 nm band and laser light L2 having a wavelength of the 650 nm band are emitted from the respective laser light emission portions (active layer) in substantially the same direction (substantially in parallel).

Figure 11:
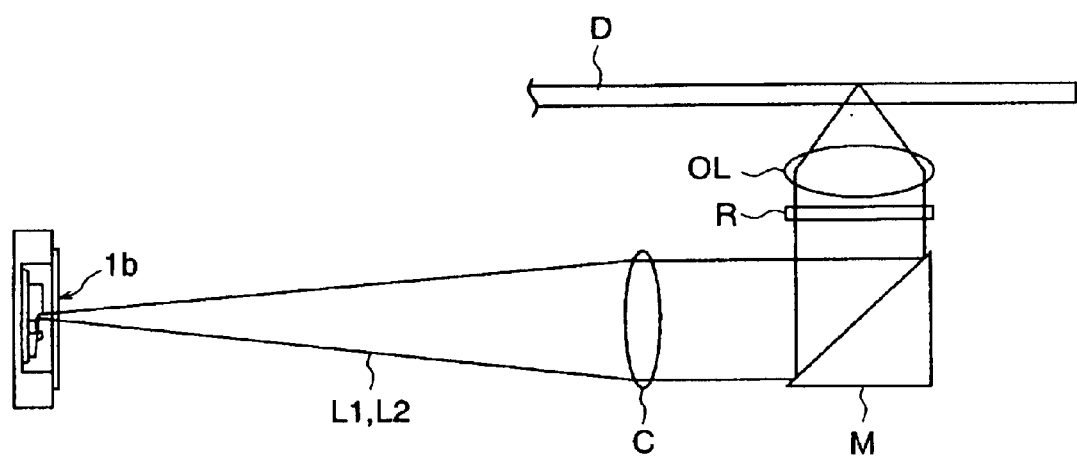
FIG. 11 is a schematic view of the configuration of an optical pickup using a laser diode incoporated in the laser coupler of FIGS. 10A and 10B.
Figure 12:
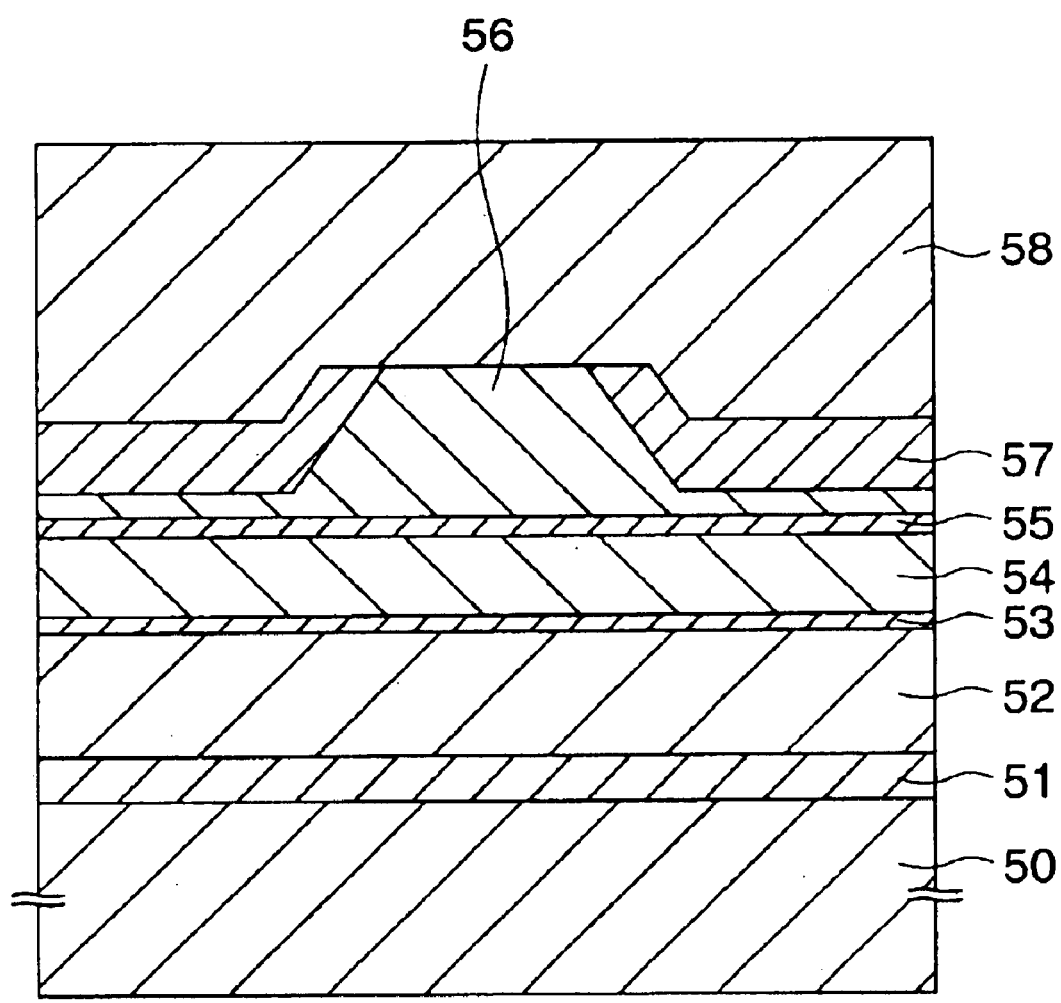
FIG. 12 is a sectional view of a laser diode according to an example of the prior art.

FIG. 11 is an example of when configuring an optical pickup by using the above laser coupler. The laser lights (L1 and L2) emitted from the first and second laser diodes built in the laser coupler 1b are focused on a CD, DVD, or other optical disk D via a collimater C, mirror M, CD use aperture R for limiting an opening, and object lens OL.

Light reflected from the optical disk D returns to the laser coupler by following the same path as the focused light and is received by the first and second photo diodes built in the laser coupler.

As explained above, by using the monolithic laser diode of the present embodiment, it is possible to reduce the number of parts and simplify the configuration of the optical system of an optical pickup having CD, DVD, or other optical disk systems of different wavelengths and to therefore make it easier to assemble, smaller in size, and lower in cost.

The present invention was explained by two embodiments above, but the present invention is not limited to the embodiments.

For example, the semiconductor material, metal material for constituting the above laser diode and thicknesses thereof may be suitably selected.

Also, the plurality of laser diodes to be monolithically mounted in the second embodiment may be not only laser diode elements having different light emission wavelengths, but also laser diode elements having different element characteristics, such as having the same light emission wavelengths but different light emission strengths. Furthermore, when a plurality of light emission elements are provided, the invention can be applied to laser diode elements having the same element characteristics. Also, the light emission wavelengths of the first and second laser diodes are not limited to the 780 nm band and 650 nm band and may be wavelengths used in other optical disk systems. Namely, an optical disk system of a different combination than CD and DVD systems may be applied. Also, laser diodes not of a self pulsation type among the plurality of laser diodes may be applied to other lasers having a variety of characteristics such as an index-guide type or a gain-guide type.

Other than the above, a variety of modifications may be made within the scope of the present invention.

Also, a semiconductor light emission element having a plurality of laser diode elements to which the present invention can be applied may be used for a semiconductor light emitting device having three or more laser diode elements.

According to the present invention, an operating current can be reduced from that in the prior art and thereby the long term reliability can be improved. Furthermore, due to this structure, only one epitaxial step is needed. It is therefore possible to reduce the number of epitaxial steps from that in the prior art and to improve the production yield.

According to the semiconductor light emitting device of the present invention, in a dual-wavelength monolithic laser diode comprised of a laser diode for example for CDs (light emission wavelength of 780 nm) and a laser diode for DVDs (light emission wavelength of 650 nm) mounted on one chip etc., it is possible to build in a laser diode of the self pulsation type excelling in noise characteristics which can reduce the operating current from that in the prior art and thereby improve the long term reliability and furthermore possible to reduce the number of epitaxial steps and to improve the production yield.

According to the method of production of a laser diode of the present invention, a laser diode of a self pulsation type excelling in noise characteristics which can reduce the operating current from that in the prior art and thereby improve the long term reliability can be produced while reducing the number of epitaxial steps and improving the production yield.

Note that the present invention is not limited to the above embodiments and includes modifications within the scope of the claims.

What is claimed is:

1. A laser diode comprising:
   a first clad layer of a first conductivity type formed on a substrate;
   an active layer formed at an upper layer of said first clad layer;
   a second clad layer of a second conductivity type formed at an upper layer of said active layer;
   a third clad layer of the second conductivity type formed at an upper layer of said second clad layer in a current injection stripe region;
   a contact layer formed at an upper layer of said third clad layer; and
   an electrode formed so as to connect said second clad layer in regions other than said current injection stripe region and to connect said contact layer;
   whereby when a first current is injected from said electrode via said contact layer by applying a predetermined voltage to said electrode and laser light is emitted from a laser light oscillation region near said active layer, a second current which is smaller than said first current is injected in regions other than said current injection stripe region from said electrode via said second clad layer and currents at ends of said laser light oscillation region are controlled for self pulsation.

2. A laser diode as set forth in claim 1, wherein saturatable absorption regions are formed at said ends of the laser light oscillation region for self pulsation.

3. A laser diode as set forth in claim 1, wherein said second clad layer comprises a AlGaInP-based material.

4. A laser diode as set forth in claim 1, wherein a material of said electrode at a portion contacting said second clad layer comprises titanium.

5. A laser diode as set forth in claim 4, wherein said electrode comprises stacked layers of titanium, platinum, and gold and formed so as to contact said second clad layer and contact layer from the titanium side.

6. A laser diode as set forth in claim 1, comprising an etching stop layer between said second clad layer and said third clad layer.

7. A laser diode as set forth in claim 1, wherein a degree of self pulsation can be adjusted by a thickness of said third clad layer and a width of said current injection stripe region.

8. A laser diode as set forth in claim 1, wherein a thickness of said third clad layer is in a range of 0.1 to 0.7 $\mu$m.

9. A laser diode as set forth in claim 1, wherein a width of said current injection stripe region is in a range of 1.5 to 5 $\mu$m.

10. A semiconductor light emitting device comprising a plurality of laser diode elements, wherein at least one of said laser diode elements comprises:
    a first clad layer of a first conductivity type formed on a substrate;
    an active layer formed at an upper layer of said first clad layer;
    a second clad layer of a second conductivity type formed at an upper layer of said active layer;
    a third clad layer of the second conductivity type formed at an upper layer of said second clad layer in a current injection stripe region;
    a contact layer formed at an upper layer of said third clad layer; and
    an electrode formed so as to connect said second clad layer in regions other than said current injection stripe region and to connect said contact layer; and
    whereby said at least one of said laser diode elements is a laser diode wherein, when a first current is injected from said electrode via said contact layer by applying a predetermined voltage to said electrode and a laser light is emitted from a laser light oscillation region near said active layer, a second current which is smaller than said first current is injected in regions other than said current injection stripe region from said electrode via said second clad layer and currents at ends of said laser light oscillation region are controlled for self pulsation.

11. A semiconductor light emitting device as set forth in claim 10, wherein said plurality of laser diode elements are formed on said same substrate.

* * * * *